United States Patent [19]
Knipp

[11] Patent Number: 5,288,971
[45] Date of Patent: Feb. 22, 1994

[54] SYSTEM FOR IGNITING A PLASMA FOR THIN FILM PROCESSING

[75] Inventor: Lawrence J. Knipp, Fort Collins, Colo.

[73] Assignee: Advanced Energy Industries, Inc., Fort Collins, Colo.

[21] Appl. No.: 743,276

[22] Filed: Aug. 9, 1991

[51] Int. Cl.⁵ ............................................. H01J 7/24
[52] U.S. Cl. .................... 219/121.57; 315/111.21; 204/298.08; 313/231.31
[58] Field of Search ..................... 219/121.57; 315/111.21-111.71; 427/39, 34; 118/50.1, 723; 204/164, 298.08, 192.12-192.13; 156/643-646; 313/231.31, 231.41, 231.61

[56] References Cited

U.S. PATENT DOCUMENTS

| | | | |
|---|---|---|---|
| 3,569,777 | 3/1971 | Beaudry | 315/111.21 |
| 3,616,405 | 10/1971 | Beaudry | 204/192 |
| 3,704,219 | 11/1972 | McDowell | 204/298.08 |
| 3,763,031 | 10/1973 | Scow et al. | 204/298.08 |
| 4,032,862 | 6/1977 | Huchital et al. | 315/284 |
| 4,306,175 | 12/1981 | Schleicher et al. | 315/111.21 |
| 4,629,887 | 12/1986 | Bernier | 250/251 |
| 4,629,940 | 12/1986 | Gagne et al. | 315/111.21 |
| 4,803,405 | 2/1989 | Nakano et al. | 315/111.21 |
| 4,956,582 | 9/1990 | Bourassa | 315/111.21 |
| 4,990,859 | 2/1991 | Bouyer et al. | 324/649 |
| 5,077,499 | 12/1991 | Oku | 315/111.21 |
| 5,116,482 | 5/1992 | Setoyama et al. | 204/298.08 |
| 5,118,996 | 6/1992 | El-Hamamsy et al. | 315/248 |
| 5,140,223 | 8/1992 | Gesche et al. | 315/111.21 |

FOREIGN PATENT DOCUMENTS

| | | |
|---|---|---|
| 1514322 | 9/1969 | Fed. Rep. of Germany . |
| 58-158929 | 9/1983 | Japan . |
| 60-98168 | 6/1985 | Japan . |

OTHER PUBLICATIONS

Norstrom, "Experimental and Design Information For Calculating Impedance Matching Networks For Use In RF Sputtering and Plasma Chemistry", Oct. 1979.
Mazza, "Automatic Impedance Matching System for RF Sputtering", IBM J. Res. Develop., vol. 14, No. 2, Mar. 1970.
Halperin et al, "Automatic RF Sputtering System", J. Vac. Sci. Tech., 15(1), Jan.Feb. 1978.
Rahaim, "Automatic Tuning Controller for Anode Tuned Sputtering System", IBM Tech. Disclosure vol. 19, No. 11, Apr. 1977.

*Primary Examiner*—Bruce A. Reynolds
*Assistant Examiner*—John A. Jeffery
*Attorney, Agent, or Firm*—Luke Santangelo

[57] ABSTRACT

A system for igniting a plasma in thin film processing is shown whereby matching network impedances are varied to effect voltage changes. Shunt and series capacitors vary around a limited range so as to achieve substantially all possibilities. A programmed routine of varying in phase, out of phase, and 90° apart in phase is accomplished with a range +/−10% of full variation around some prior value likely to support ignition.

40 Claims, 6 Drawing Sheets

SYSTEM FOR IGNITING A PLASMA FOR THIN FILM PROCESSING

BACKGROUND OF THE INVENTION

This invention relates generally to the field of thin film processing such as is used in depositing or removing material from an article and as is often used in the creation of semi-conductor devices. Specifically, the invention relates to the narrower aspect of igniting a plasma in a processing system within which thin film processing is effected by the plasma.

The field of thin film processing broadly encompasses a number of different techniques whereby metallic and non-metallic materials are deposited or removed from an item. This may be accomplished in a variety of ways. One technique involves the use of a plasma of charged particles to effect the processing. Since the popularity of this technique—as well as that of thin film processing in general—has greatly increased in recent years due to the demand for semi-conductor devices, effort has been directed to the actual processing of items or substrates through the utilization of a plasma. In sharp contrast, however, the aspect of actually igniting the plasma in such a system has been relatively ignored. This is perhaps due to the fact that in some applications a plasma can be easily ignited. This is not the case, however, for many thin film processing applications, and is even less the case as processing becomes more exact.

Currently, many thin film processing applications involve the precise processing of one or more items in a very dynamic environment. This dynamic environment is not only unpredictable, it causes fluctuation in a variety of characteristics necessary to cause the gas involved to ignite into a plasma. Thus, while in other applications the plasma can be ignited by merely achieving the necessary conditions, in most thin film processing applications, this is not possible. The dynamic nature of the chamber itself and its unpredictability, make knowing the conditions necessary for ignition extremely difficult from a practical perspective.

In addition, two other aspects exist which explain the difficulty those attempting to ignite a plasma for thin film processing have faced. First, as mentioned, the processing is often very delicate. As semi-conductor manufacturing techniques have been refined, the thickness of the layers within them has decreased to the atomic scale. Thus, tolerances within the processing itself have become much more exacting. While at first glance this would appear to relate only to the operation of the plasma, not to its ignition, such is not the case as the environment during ignition itself can literally ruin the processing desired. Prior to the present invention, however, a technique for igniting a plasma in a processing system which affirmatively minimized undesirable effects has not existed. That those skilled in the art simply did not recognize the teachings of the present invention even though the implementing arts were well known and available is evidenced by the fact that in some systems, literally additional mechanical devices functioning as shutters have been included to protect the item to be processed during an ignition phase.

A second aspect which explains the challenges faced by those skilled in the art, is the fact that processing itself has evolved almost as an eclectic art. While on the one hand the physical and chemical processes involved during thin film processing have been studied and refined from very theoretical bases to produce state of the art devices, still, oftentimes, some of the equipment utilized to actually achieve the thin film processing has been what could be characterized as antiquated equipment and has been applied on what might even be characterized as a trial-and-error basis. This aspect is perhaps best demonstrated by the fact that vital electrical components in many systems are devices originally designed in the 1920's even though greatly improved parallels are well known for application to other fields. Simply put, it may be said that while those skilled in the art of thin film processing might typically have a great degree of skill and technical knowledge in the plasma processes themselves, those so skilled rarely combined such knowledge with equivalent understanding of the high frequency electrical circuitry characteristics as well.

These facts also in part explain why, until the present invention, those skilled in the art have not realized the teachings of this invention even though the implementing arts have long been available and even though those skilled in the art have long felt a need to achieve the objects of the present invention. The preconceptions fostered by those skilled in one field but not another have fostered those in the art to either accomplish ignition of a plasma through different techniques or to effect solutions which in hindsight might appear not well thought out.

Prior to the present invention, several techniques were known to ignite plasmas in general. Primarily, these techniques involve the addition of separate equipment in order to achieve the conditions necessary to ignite the gas into a plasma. An example of these is U.S. Pat. No. 4,906,811 which discloses the addition of separate equipment to locally increase pressure in the gas to effect conditions more conducive to the ignition of the gas into a plasma. Different techniques similarly add separate equipment to create other such drastic changes. U.S. Pat. No. 4,557,819 disclose a separate DC voltage source to momentarily increase the voltage across the gas by about 5,000 volts; U.S. Pat. No. 4,888,088 discloses a separate, lower frequency power source to achieve ignition; and finally, U.S. Pat. No. 4,859,909 discloses the utilization of ion sources or electron sources to prompt the ignition of the gas into a plasma. As mentioned, each of these utilizes separate equipment to effect gross changes under which ignition of the plasma is almost certain to occur. In addition to this published literature, some of those skilled in the art have apparently attempted to automatically manipulate existing electrical circuitry. Some have tried preset values; some have tried sweeping tuning equipment. The techniques used however, have not been accomplished in a manner which demonstrates understanding of the electrical circuitry aspect of such processing systems.

SUMMARY OF THE INVENTION

The present invention discloses techniques which more reliably accomplish ignition of a plasma in a thin film processing system. By making subtle changes to the way in which existing equipment is operated, significant increases in performance are achieved.

Generally, the invention involves utilization of the automatically variable capacitors of existing matching networks to achieve ignition. A program is instituted which combines two elements and varies those elements in a fashion to achieve reliable ignition of the plasma.

The variation is both limited to a range probable to support ignition and accomplished in a manner which tests substantially all possibilities in the system. Thus the technique is not critically dependent upon assumptions with respect to the characteristics of the processing system.

Accordingly a general object of the present invention is to achieve ignition without additional equipment. In keeping with this goal, the invention teaches the uses of operating equipment for ignition purposes. As one embodiment, it is the goal of the invention to manipulate the operating equipment in a fashion which is likely to quickly and reliably ignite the plasma. In establishing this technique another goal is to establish broad criteria from which a variety of techniques can be developed to allow the use of multiple components to achieve sufficient variation to cause ignition.

Another broad object of the present invention is to minimize the impact of ignition within a processing system. An object is thus to allow ignition while avoiding separate inputs to the processing environment. In accomplishing these goals, the invention has been designed to allow variations and techniques such that ignition can be accomplished either with minimum impact or in the quickest fashion.

Yet another broad object of the invention is to establish fundamental criteria which can then be varied to create a variety of techniques to achieve reliable ignition. As one technique, the invention teaches the manipulation of the impedance and thus the voltage transformation characteristics of the operating circuit to effect ignition. As part of the broadly stated goal it is an object of the invention to accommodate changing conditions inherent in a processing system. In establishing one possible technique, an object of the invention is to begin with a high probability setting and to then utilize as small as possible variations in this setting to attempt ignition. As an object, the invention sets a range within which ignition is likely to occur and then tests substantially all possibilities within this range. Finally, the invention suggests one combination of elements which can be utilized to effectively accomplish ignition. Naturally, further objects of the invention are disclosed throughout other areas of the specification and claims.

DESCRIPTION OF THE PREFERRED EMBODIMENT

As will be understood, the invention broadly teaches the characteristics from which numerous techniques can be developed. While FIG. 1 diagrams the programming of one technique, numerous other techniques are possible and yet will still fall within the teachings of this invention. To understand the breath of this invention, thin film processing through the utilization of a plasma in general should be understood.

Figure 2:
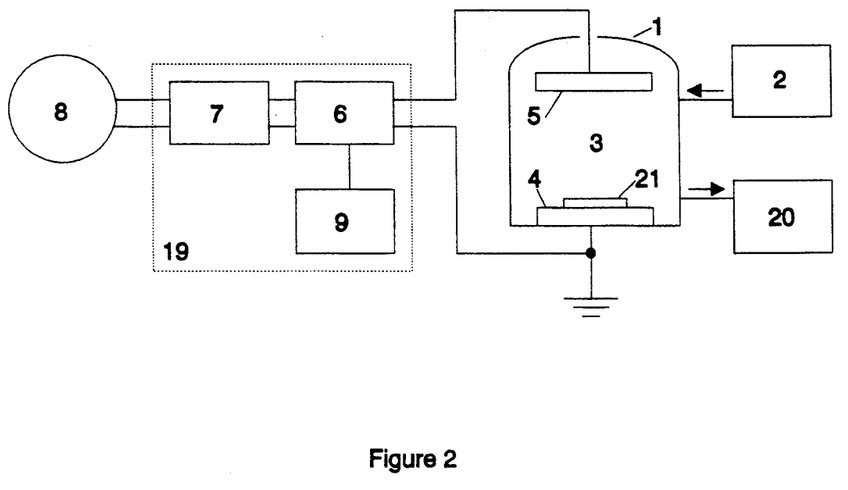
FIG. 2 is a block diagram of a processing system consistent with the embodiment of the invention shown diagrammatically in FIG. 1.

Referring to FIG. 2, the block diagram of a typical plasma processing system, the basics can be easily understood. Such a system involves chamber (1) into which an item to be processed (21) has been placed. Within chamber (1) usually a vacuum is maintained through the use of vacuum pump (20). Process gas (2) is fed into chamber (1) and is maintained at some desired pressure. Electrodes (4 and 5) within chamber (1) are connected to operating circuitry (19) which acts within chamber (1) to initially cause ignition of processing gas (2) into plasma (3) within chamber (1) and then to maintain plasma (3) for processing or operation. During plasma processing, plasma (3) acts upon item (21) within chamber (1). In this fashion, coating, etching, cleaning, or some other action may be achieved on item (21).

As can be seen from FIG. 2, operating circuitry (19) consists of several elements which may or may not be integrated as one in actual systems. Certainly power is derived from some source shown schematically in FIG. 2 as power source (8). This power is then amplified or otherwise conditioned by power supply (7). While in some systems direct current is utilized, as contemplated in one embodiment of the present invention, power supply (7) supplies alternating current typically in the radio frequency range of about 13.56 megahertz. Power supply (7) feeds its power into chamber (1) through matching network (6). Matching network (6) serves as interactive circuitry which is controlled by controller (9) to maintain constant optimum impedance in the entire processing system, including, importantly, the impedance of chamber (1) as well as of matching network (6). This optimum impedance is determined by power supply (7). Most ac power supplies are optimized to drive load impedances of 50 ohms. In order to achieve this in the highly variable conditions which typically exist within the chamber during processing, matching network (6) contains one or more variable elements. These variable elements are controlled by controller (9) to achieve the desired result.

In operation, it should be understood that the characteristics of operating circuitry (19) may be very different for ignition than they are for steady state operation. At the time of ignition, plasma (3) does not exist within chamber (1). Rather, only gas (2), usually at very low pressure, exists between electrode (4) and electrode (5). During operation, plasma (3) exists within chamber (1). This greatly changes the impedance between electrodes (4 and 5) of chamber (1) and therefore the impedance set for operating circuitry (19) by matching network (6). Thus the impedance of chamber (1) and hence that which might be set for operating circuitry (19) through matching network (6) is much different during ignition than during steady state operation. To achieve ignition, according to the present invention, matching network (6) is manipulated through controller (9) in a fashion which is likely to cause the appropriate conditions such that gas (2) will ignite into plasma (3).

Figure 6:
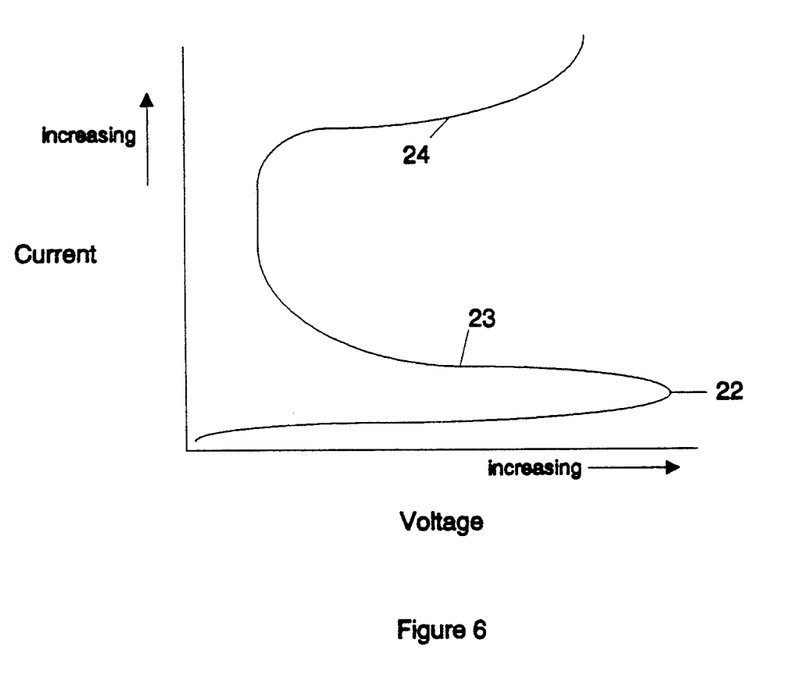
FIG. 6 is a graph showing the relationship of the voltage across and current through the plasma.

A graph which shows the relationship of the voltage across and the current flowing through a plasma is shown in FIG. 6. As is well known in the art, in order to ignite gas (2) into plasma (3), a sufficient voltage is necessary. This voltage is supplied through power supply (7) and acts to force electrons to flow through the gas atoms. These electrons strike gas atoms, and the desired effect is to knock another electron off of gas atom, thus forming a gas ion, and two free electrons. Initially, the amount of electrons which are stripped away are small. As the voltage is increased, there is a point where the number of electrons increases dramatically; this is ignition point (22). Because of the extra electrons which are freed from the gas atoms, the voltage/current relationship then traverses through a negative impedance region (23). Eventually (within milliseconds) a steady state condition (24) is reached and this is the stable operating point of the plasma.

Figure 5:
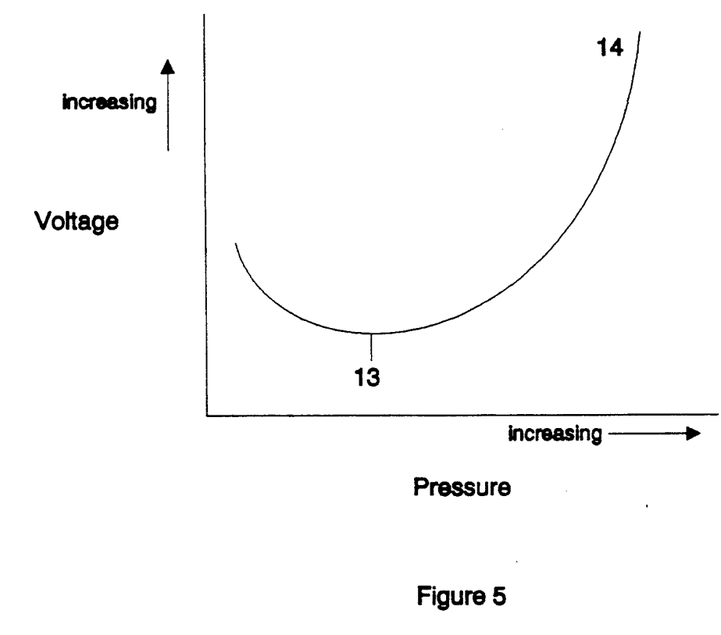
FIG. 5 is a plot of ignition voltage as a function of pressure.

Ignition point (22) is a function of gas pressure, electrode spacing and size, and other chamber characteristics. The relationship between pressure and ignition voltage is referred to in the industry as a Paschen curve and is shown in FIG. 5. The Paschen voltage (14) decreases as pressure is decreased until it reaches a minimum value (13) which correlates to a certain pressure. Below this pressure, the Paschen voltage (14) again increases. Perhaps because the Paschen curve has been well studied, solutions utilizing pressure increases as in U.S. Pat. No. 4,906,811 are often utilized. Since conditions likely to support ignition can be reached in a variety of ways, the present invention teaches varying any parameter. While it is shown as impedance in the preferred embodiment, other parameters could, of course, be selected. All that is necessary is that the parameter(s) selected to be varied be likely to effect ignition.

Figure 3:
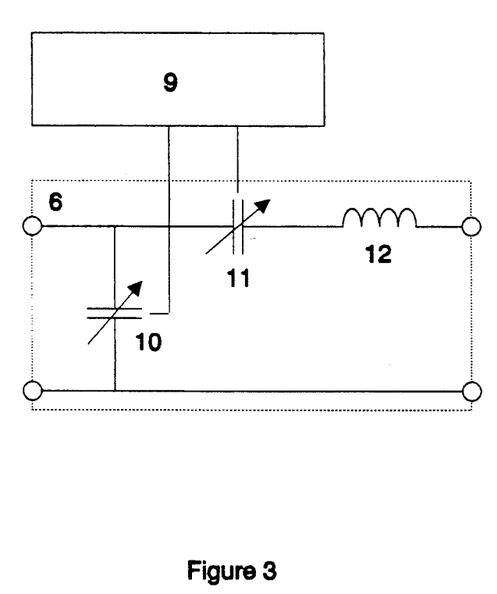
FIG. 3 is a simplified electrical schematic of a matching network having variable capacitors consistent with the embodiment shown in FIGS. 1 and 2.

As mentioned, the actual impedance of plasma (3) may vary depending on multiple parameters of the processing system, including gas, pressure, loading (the amount of and types of material to be processed), temperature, moisture and many other criteria. It is also true that in many cases the ignition point is quite different than the operating point and can change from run to run. To accommodate variations during operation, matching networks oftentimes include one or more variable elements or components. This allows the matching network to match to a range of impedances rather than just to a single point. A typical matching network is illustrated in FIG. 3. While the variable elements may include inductors, capacitors, switching devices, and almost any other component, in the preferred embodiment such variable elements are shown as variable capacitors. These capacitors are selected so as to have a full range which bears some relationship to—and is usually some percentage larger than—the variation encountered in operation. Matching network (6) is thus shown as having variable shunt capacitor (10), and variable series capacitor (11). It also includes a series inductor (12). In the present embodiment, controller (9) is used to adjust variable shunt capacitor (10) and variable series capacitor (11) so that maximum power transfer is achieved.

At 13.56 MHz, matching network (6) acts as a voltage transformer between power supply (7) and chamber electrodes (4 and 5), affecting the voltage across gas (2). It has been recognized by some that presetting variable elements, such as the capacitors to certain values which are likely to support ignition will enhance the likelihood of a swift ignition. These prior ignition setting preset positions may be determined by observing the positions of the variable capacitors at the time of plasma ignition. Such values may be set manually. They may also be determined or established by a means such as a microprocessor and retained and set by reading a memory. In this fashion the means for setting the initial value might be more automatic. These prior ignition settings may be updated each time ignition occurs, or may be set less frequently. Thus, any prior value can be utilized. In the embodiment contemplated, some setting is stored in program memory as both an initial shunt capacitor (17) value and an initial series capacitor value (18).

Unfortunately, utilizing the initial shunt capacitor value and the initial series capacitor value as described as preset positions do not always result in ignition of plasma (3). This is due to the varying chamber parameters such as mentioned earlier. Each has an effect on the pre-ignition impedance of chamber (1). These parameters may have changed the present ignition and present operating points from the previous ignition and previous operating points. Thus, some means for varying the elements is utilized. In this case, this means is actually motors driving the shunt and series capacitors. These motors are governed by controller (9) which is responsive to internal programming. Hardwired or other variable means are also possible.

Many industrial plasma processing systems are highly automated. In the case where the plasma does not ignite, one practice is to abort the automatic operation of processing, thus resulting in lost processing time and requiring operator intervention to track down the cause of the problem and possibly recalibrating the preset positions of variable shunt capacitor (10) and variable series capacitor (11). The present invention overcomes this limitation in simple fashion. By slightly varying or dithering variable shunt capacitor (10) and variable series capacitor (11) around some preset positions, compensation for slight chamber parameter changes can be made. If this variation is accomplished automatically, the range of variation is minimized to that which is likely to support ignition. By using a limited range it can be assured that important values are not missed without unduly delaying the time necessary to cause ignition and without impacting the processing system. Thus the probability of proper ignition is greatly increased and no operator intervention is required after the initial preset positions have been set. Importantly, the way in which each is varied is selected in a manner so as to try substantially all possibilities within such range, unlike prior efforts.

Figure 1:
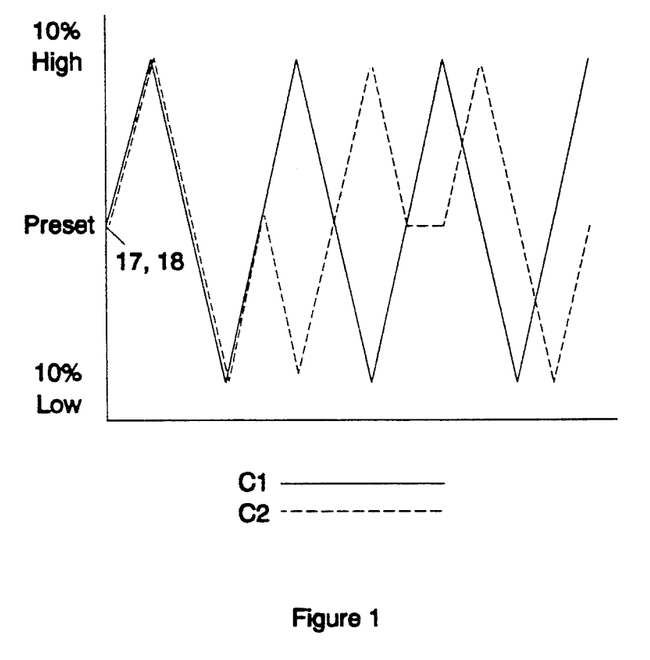
FIG. 1 is a diagram of the variation of two parameters over time according to one embodiment of the present invention.
Figure 4:
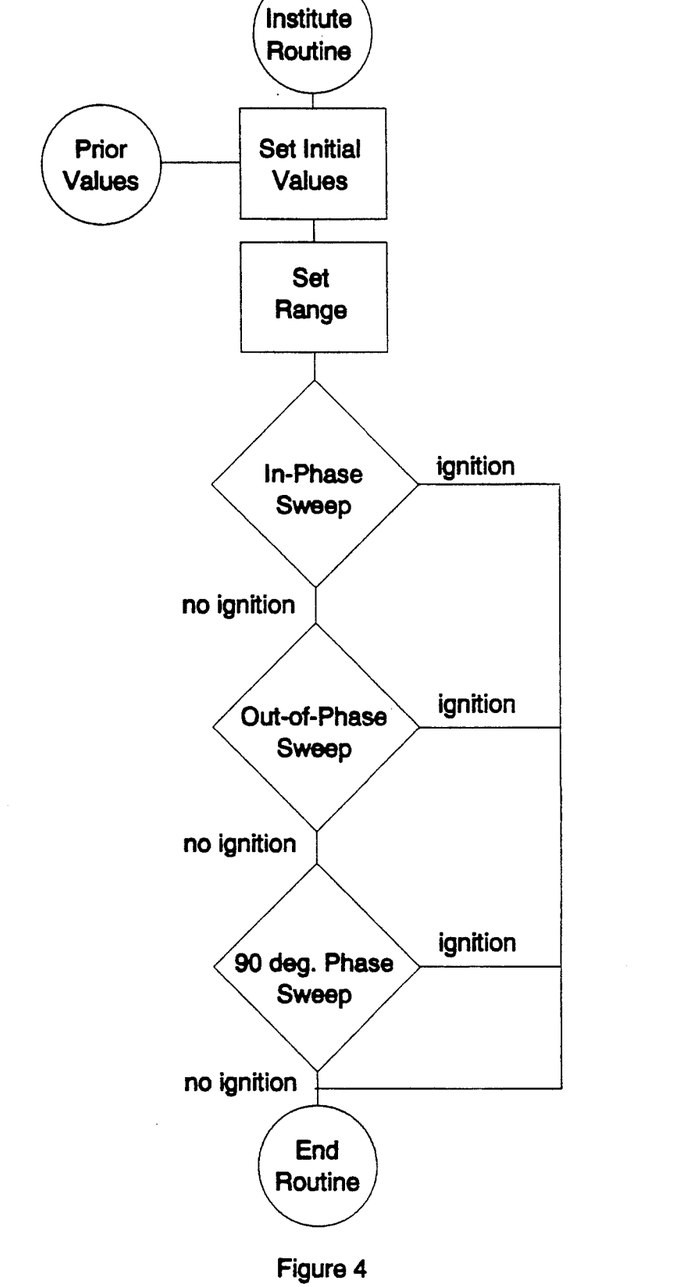
FIG. 4 is a flow chart of the embodiment of the present invention shown diagrammatically in FIG. 1.

In matching network (6) shown herein, controller (9) is used to store the preset positions of variable shunt capacitor (10) and variable series capacitor (11). The method of control which is used in controller (9) can be hardwired logic or microprocessor controlled. For the embodiment shown, as the ac power is applied to chamber (1) through matching network (6), controller (9) initiates the routine which is described in FIG. 4. As mentioned elsewhere, it should be understood that while FIG. 4 shows the step of establishing or setting the range as part of the routine, this is shown for illustrative purposes only as the preferred embodiment sets the range through separate programmed memory. An effort is made to substantially try all values within a range of voltage transformations which will likely result in ignition of plasma (3). FIG. 1 graphically illustrates the sequence which has been presently instituted in sweeping the values of variable shunt capacitor (10) and variable series capacitor (11). Varying the capacitors by + and −10% of their full range around some preset value is only one convenient possibility of the variation limits which can be instituted. The sequence which is shown in FIG. 1, consisting of in phase, out of phase, and 90° out of phase sweeping is non-random and is intended to try the extreme variations of the combinations of the capacitor values. It is also but one way to cause variation. Again with the use of proper programming even that range could be refined. It could use a percentage of the operating range, or could develop its own range likely to support ignition for that system in that application and the like. Each such extension would be easily understood, once those skilled in the art understand the present invention. It should also be understood that a range of "about ten percent" is intended to afford large variation and still fall within the scope of the present invention. Ten percent has been chosen almost arbitrarily, thus large variation in this range is permissible within the scope of invention.

Other possibilities in the variation routine are of course plausible. Further refinements to force the variations in variable shunt capacitor (10) and variable series capacitor (11) to progressively deviate can certainly be instituted, as well as a means to automatically record the present ignition values of the said capacitors. The rate at which the values of said variable capacitors change and the differences between them may also be varied and optimized. The somewhat unpredictable characteristics of the un-ignited chamber impedances and the operating plasma impedances make precise predictions as to range requirements difficult and since empirically determined ranges seem to work well, such may be unnecessary.

There are several parameters within each plasma processing system which could be varied in order to reach an ignition point. These include elements which are used within a matching network. As in the above discussion, elements within a matching network can be varied in an effort to increase the voltage potential across gas (2). This is also applicable in systems which may utilize tuned stubs such as in microwave applications. Frequency of the ac power may also be varied. Varying the frequency will result in a net reactance change in any reactive components connected to the system. Varying the frequency will have the effect of increasing or decreasing the voltage across gas (2). Gas pressure may also be varied by both temporarily increasing or decreasing to support ignition at a lower voltage as illustrated in the Paschen curve, FIG. 5. Switching speed of some dc component may be varied. Some applications may utilize a dc source which is being switched into a reactive load. Since the switching rate has a direct correlation to the voltage which is developed, varying the switching speed can be a valid attempt at optimizing voltage across said gas.

It is of course theoretically possible to determine all of the possibilities of variable parameters for a given system; to then determine how each of these parameters rank with regards to having the greatest positive impact on the ignition of the plasma, and finally vary each of these parameters progressively until ignition is achieved. Since voltage variation through varying impedance is selected in the preferred embodiment, it is useful to vary more than one element. This not only allows minimal variations in situations where the two elements' variations combine, it accommodates ac circuit characteristics. By selecting shunt capacitor (10) and series capacitor (11) to be varied, phase changes can be achieved in both directions to accomplish the necessary voltage change. Since shunt capacitor (10) has a direct correlation to the voltage across gas (2) and since series capacitor (11) has a large impact on the multiplication of the voltage, large variation can be achieved. Selecting series capacitor (10) and shunt capacitor (11) to be varied may result in choosing components to which the resulting voltage is highly sensitive. For instance with realistic values, it has been found that the seemingly minor 10% variations discussed earlier actually can result variations of from fractions to orders of magnitude in the resultant voltage. Since mechanical wear is a practical factor in such systems, selecting components which can cause the most variation in the parameter considered or which affect the voltage across the gas to about the most significant degree can be advantageous. In essence all that need be considered is which element affects the voltage or other selected parameter to the highest degree.

The technique of using only a range is perhaps surprising to those skilled in the art, because of a precondition to assume that full range variation would achieve the most change in voltage. This could have been due to the fact that the phase-magnitude detectors in use actually lead them to such an erroneous conclusion. The present invention overcomes the limitation to achieve its substantial increases in performance.

As mentioned, trying substantially all possibilities is an important departure from the prior art. Referring to FIG. 1, it can be understood how the preferred embodiment uses initially three sequences to achieve this end. First shunt capacitor (10) and series capacitor (11) are varied in phase, both up and down at the same time. Next they are varied 180° out of phase, one up and the other down or so. Finally, they are varied by 90° apart such that crossing points occur part way out of the range. The orders of such steps may not be critical.

From this teaching, it is obvious that many other sequences can be chosen. As one possibility the sequence of advancing beyond the three capacitor phasing relationships can be considered as the next step if ignition does not occur. Different phasing relationships of −90°, +45°, −45° are entirely possible and perhaps the next most likely to cause ignition. Every combination of shunt capacitor value and series capacitor value is unique. Thus the term "substantially all possibilities" is necessarily flexible. In some systems only a two step variation may be necessary, while in others more than three may be needed. Thus "substantially" depends on the sensitivity of the system. Controller (9) can thus serve as one means for creating substantially all possibilities. Other possibilities such as separate circuitry are also possible. By using a series of steps, decreasing tolerances can be achieved such that the possibilities tried can be refined to try more-and-more points. Permutations and combinations of the various values of the elements may also be considered.

Utilizing the sweeping function as described herein represents an open loop ignition system. The components are varied in such a way as to make ignition highly likely. For simplicity, this is done without any direct feedback on how the variation of each component impacts the voltage across electrodes (4 and 5). It is also possible to utilize a voltage probe to recognize the impact of the parameter variations, and thus utilize this information to more optimally vary the parameters which have the greatest impact on the voltage. Thus, the specific variations which causes the highest voltage could be accomplished automatically. As mentioned earlier, minimizing impact on the item to be processed can be a separate goal of the invention. Controller (9) can again serve as such a means as well as utilization of a limited range. Assuming minimal impact in one application means the least component deviation from typical operating conditions, a separate routine stepping through ranges could of course be used. In addition, merely using a +/−10% range rather than the full range variation can serve as such a means. Controller (9) could also be programmed to progressively deviate, that is try one small range or voltage increase then increase such range or voltage increase in order to just achieve ignition. Conversely, rapid ignition could be selected for some applications by driving the largest possible voltage increase as quickly as possible.

The foregoing discussion and the claims which follow describe the preferred embodiments of the present invention. Particularly with respect to the claims, it should be understood that changes may be made without departing from its essence. In this regard, it is intended that such changes would still fall within the scope of the present invention. It simply is not practical to describe and claim all possible revisions to the present invention which may be accomplished; elements of each claim can also be combined in many ways and still fall within the scope of this invention. To the extent such revisions utilize the essence of the present invention, each would naturally fall within the breadth of protection encompassed by this patent. This is particularly true for the present invention since it presents concepts and teaches techniques which are somewhat fundamental in nature and can be broadly applied.

I claim:

1. A method of igniting a plasma in a plasma processing system comprising the steps of:
   a. establishing a gas within a processing chamber;
   b. determining an initial value of a parameter of said system which is likely to cause said gas to ignite into a plasma;
   c. setting a limited range of values around said initial value, wherein said limited range of values is likely to support ignition of said plasma;
   d. applying electrical power to said gas; and
   e. varying said parameter within said limited range of values said range not necessarily causing a specific impedance to obtain ignition of said plasma.

2. A method of igniting a plasma in a plasma processing system as described in claim 1 wherein said initial value is some value at which said plasma previously ignited.

3. A method of igniting a plasma in a plasma processing system as described in claim 2 wherein said step of applying electrical power involves the step of connecting said chamber to electrical circuitry, wherein said electrical circuitry has a shunt capacitor and a series capacitor, wherein said initial value includes an initial shunt capacitor value and an initial series capacitor value, wherein said shunt and series capacitors are capable of varying over some limits during typical operation and wherein said step of setting said limited range of values around said initial value, wherein said limited range of values is likely to support ignition of said plasma comprises the step of setting said range as said initial capacitor values plus and minus about ten percent of said limits of said capacitors.

4. A method of igniting a plasma in a plasma processing system as described in claim 2 wherein said electrical circuitry has a shunt capacitor and a series capacitor, wherein said initial value is an initial shunt capacitor value and an initial series capacitor value, wherein said shunt and series capacitors are capable of varying over a full range and wherein said step of setting said limited range of values around said initial value comprises the step of setting said range as said initial capacitor values plus and minus about ten percent of said full range.

5. A method of igniting a plasma in a plasma processing system comprising the steps of:
   a. establishing a gas within a processing chamber;
   b. determining a parameter of said system which is likely to affect the ignition of said gas into a plasma;
   c. setting a limited range of values for said parameter within which said gas is likely to ignite into a plasma; then
   d. varying said parameter within said limited range of values to obtain ignition of said plasma.

6. A method of igniting a plasma in a plasma processing system as described in claim 5 wherein said step of varying said parameter comprises the step of varying within said range so as to try substantially all possibilities within said range.

7. A method of igniting a plasma in a plasma processing system as described in claim 6 wherein said parameter may be characterized by more than one variable component, and wherein said step of varying said parameter comprises the step of automatically varying at least two of said components so as to try substantially all possibilities of said components.

8. A method of igniting a plasma in a plasma processing system as described in claim 7 wherein said step of varying said parameter comprises the step of varying each of said components so as to achieve decreasing tolerances in the variation of said parameter.

9. A method of igniting a plasma in a plasma processing system as described in claim 6 wherein said parameter may be characterized by more than two variable components wherein the step of varying at least two components comprises the step of varying a first variable component and a second variable component, and wherein said first variable component and said second variable component are the variable components which cause the most variation in said parameter.

10. A method of igniting a plasma in a plasma processing system as described in claim 7 wherein said electrical circuitry has a shunt capacitor and a series capacitor and wherein said step of varying both said first and said second variable components of said circuit comprises the step of varying said shunt capacitor and the step of varying said series capacitor.

11. A method of igniting a plasma in a plasma processing system as described in claim 7 wherein said step of varying both the shunt and series capacitor comprises the steps of:
    a. varying said capacitors in phase;
    b. varying said capacitors 180 degrees out of phase; and
    c. varying said capacitors 90 degrees apart in phase.

12. A method of igniting a plasma in a plasma processing system comprising the steps of:
    a. establishing a gas within a processing chamber;
    b. connecting said processing chamber to processing apparatus having a first and a second variable component;
    c. applying electrical power to said gas; and
    d. igniting said gas into a plasma through automatic operation of said processing apparatus wherein said automatic operation comprises the steps of:
       i) varying said first and second variable components in phase;
       ii) varying said first and second variable components 180 degrees out of phase; and iii) varying said first and second variable components 90 degrees apart in phase.

13. A method of igniting a plasma in a plasma processing system comprising the steps of:
  a. establishing a gas within a processing chamber;
  b. connecting said processing chamber to processing apparatus for processing an item under operating conditions;
  c. applying electrical power to said gas; and
  d. igniting said gas into a plasma through automatic operation of said processing apparatus while accomplishing the step of minimizing any impact on said item due to the ignition of said gas into a plasma wherein the step of igniting does not necessarily cause a specific impedance.

14. A method of igniting a plasma in a plasma processing system as described in claim 13 wherein said step of minimizing any impact on said item to be processed comprises the step of utilizing minimal variation from said operating conditions to ignite said gas.

15. A method of igniting a plasma in a plasma processing system as described in claim 13 and further comprising the step of selecting a parameter which to vary to ignite said gas which minimizes impact on said item to be processed.

16. A method of igniting a plasma in a plasma processing system as described in claim 15 wherein said processing apparatus comprises electrical circuitry and wherein said parameter is the impedance of said electrical circuitry.

17. A method of igniting a plasma in a plasma processing system as described in claim 13 wherein said step of igniting said gas with minimal impact on said item to be processed comprises the step of progressively deviating from said operating conditions.

18. A method of igniting a plasma in a plasma processing system as described in claim 13 wherein said step of igniting said gas with minimal impact on said item to be processed comprises the step of setting a range within which ignition is likely and varying within said range.

19. A method of igniting a plasma in a plasma processing system as described in claim 13 wherein said step of igniting said gas with minimal impact on said item to be processed comprises the step of setting a range within which ignition is likely and progressively varying within said range.

20. A system for igniting a plasma for processing an item comprising:
  a. a chamber within which a gas is contained;
  b. electrical circuitry having a plurality of parameters and connected to said chamber for effecting processing within said chamber;
  c. a means for igniting said gas into a plasma capable of affecting said chamber, wherein said means for igniting comprises:
    i) a means for establishing a limited range of values for a parameter of said electrical circuitry which is likely to support ignition; and
    ii) a means for varying said parameter within said established limited range of values said range not necessarily causing a specific impedance so as to ignite said gas into a plasma.

21. A system for igniting a plasma for processing an item as described in claim 20 wherein said electrical circuitry comprises operating circuitry and wherein said means for igniting operates so as to vary said operating circuitry.

22. A system for igniting a plasma for processing an item as described in claim 21 wherein said operating circuitry comprises a matching network and wherein said means for igniting varies said matching network.

23. A system for igniting a plasma for processing an item as described in claim 22 wherein said matching network has a shunt capacitor and a series capacitor and wherein said means for igniting comprises a means for varying both said shunt and series capacitors.

24. A system for igniting a plasma for processing an item as described in claim 23 and further comprising a means for creating substantially all possibilities of said parameter in order to ignite said gas into a plasma.

25. A system for igniting a plasma for processing an item as described in claim 24 wherein said means for creating substantially all possibilities of said parameter in order to ignite said gas into a plasma comprises a means for decreasing tolerances in the variation of said parameter.

26. A system for igniting a plasma for processing an item as described in claim 24 wherein said means for varying both said shunt and series capacitors comprises:
  a. a means for varying said capacitors in phase;
  b. a means for varying said capacitors 180 degrees out of phase; and
  c. a means for varying said capacitors 90 degrees apart in phase.

27. A system for igniting a plasma for processing an item as described in claim 20 wherein said electrical circuitry comprises operating circuitry and wherein said means for igniting operates so as to only vary said operating circuitry.

28. A system for igniting a plasma for processing an item as described in claim 22 wherein said operating circuitry has more than two variable elements each capable of affecting a voltage across said gas to some degree and wherein said means for igniting operates so as to vary the two of said variable elements which are capable of affecting the voltage across said gas to the most significant degree.

29. A system for igniting a plasma for processing an item as described in claim 20 wherein said electrical circuitry has more than one variable element and wherein said means for varying operates so as to vary at least two of said variable elements.

30. A system for igniting a plasma for processing an item as described in claim 20 and further comprising a means for creating substantially all possibilities of said parameter in order to ignite said gas into a plasma.

31. A system for igniting a plasma for processing an item as described in claim 20 wherein said means for igniting further comprises a means for setting an initial value around which said range is established.

32. A system for igniting a plasma for processing an item as described in claim 31 wherein said gas has been ignited into a plasma previously at some prior ignition setting and wherein said means for setting utilizes said prior ignition setting.

33. A system for igniting a plasma for processing an item as described in claim 32 wherein said electrical circuitry has an initial impedance and wherein said parameter is said initial impedance of said electrical circuitry.

34. A system for igniting a plasma for processing an item as described in claim 33 wherein said initial impedance is characterized in part by initial values of a shunt capacitor and a series capacitor, wherein said shunt capacitor and a series capacitor are capable of varying over some limits during typical operation, and wherein said means for establishing a range within which said parameter is automatically varied sets said range as said initial values plus and minus ten percent of said limits of said elements.

35. A system for igniting a plasma for processing an item as described in claim 20 wherein said means for igniting further comprises a means for minimizing undesirable impacts on said item to be processed.

36. A system for igniting a plasma for processing an item as described in claim 35 wherein said means for processing act primarily at an operating condition and wherein said means for minimizing comprises a means for progressively deviating from said operating condition.

37. A system for igniting a plasma for processing an item as described in claim 36 wherein said means for processing comprises electrical circuitry having an initial impedance and wherein said means for igniting comprises a means for varying said initial impedance.

38. A system for igniting a plasma for processing an item comprising:
   a. a chamber within which a gas is contained;
   b. a means for processing connected to said chamber for effecting processing of an item within said chamber; and
   c. a means for igniting said gas into a plasma wherein said means for igniting comprises said means for processing and wherein said means for processing comprises electrical circuitry having more than one element each capable of affecting a voltage across said gas to some degree and wherein said means for igniting comprises a means for varying the two of said variable elements which are capable of affecting the voltage across said gas to the most significant degree and wherein means for varying the two of said variable elements does not necessarily cause a specific impedance.

39. A system for igniting a plasma for processing an item as described in claim 38 wherein said means for igniting comprises a shunt capacitor and a series capacitor.

40. A system for igniting a plasma for processing an item as described in claim 39 wherein said means for varying comprises:
   a. a means for varying said capacitors in phase;
   b. a means for varying said capacitors 180 degrees out of phase; and
   c. a means for varying said capacitors 90 degrees apart in phase.

* * * * *